US008258024B2

(12) United States Patent
Matsumura et al.

(10) Patent No.: US 8,258,024 B2
(45) Date of Patent: Sep. 4, 2012

(54) DISPLAY DEVICE AND METHOD OF MANUFACTURING THE SAME

(75) Inventors: Mieko Matsumura, Kokubunji (JP); Mutsuko Hatano, Kokubunji (JP); Yoshiaki Toyota, Koshigaya (JP); Takuo Kaitoh, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 378 days.

(21) Appl. No.: 12/606,284

(22) Filed: Oct. 27, 2009

(65) Prior Publication Data
US 2010/0102322 A1 Apr. 29, 2010

(30) Foreign Application Priority Data
Oct. 28, 2008 (JP) ................ 2008-276287

(51) Int. Cl.
*H01L 21/00* (2006.01)
*H01L 21/84* (2006.01)
(52) U.S. Cl. ......... 438/158; 438/151; 438/159; 438/164
(58) Field of Classification Search .............. 438/151, 438/158, 159, 164
See application file for complete search history.

(56) References Cited

U.S. PATENT DOCUMENTS

| 7,041,522 B2 * | 5/2006 | Tanaka et al. | 438/30 |
|---|---|---|---|
| 7,413,940 B2 * | 8/2008 | Lin | 438/158 |
| 7,858,455 B2 * | 12/2010 | Yamazaki | 438/152 |
| 2005/0094041 A1 * | 5/2005 | Oh et al. | 349/27 |
| 2007/0153170 A1 * | 7/2007 | Yao | 349/113 |
| 2008/0006827 A1 * | 1/2008 | Shim et al. | 257/72 |
| 2009/0148970 A1 * | 6/2009 | Hosoya et al. | 438/29 |
| 2009/0231310 A1 * | 9/2009 | Tsai et al. | 345/205 |

FOREIGN PATENT DOCUMENTS

JP    2005-167051    6/2005

OTHER PUBLICATIONS

T. Kaitoh et al.; SELAX Technology for Poly-Si TFTs Integrated with Amorphos-Si TFTs; International Display Workshop 2007, pp. 481-484.

\* cited by examiner

*Primary Examiner* — Bac Au
(74) *Attorney, Agent, or Firm* — Antonelli, Terry, Stout & Kraus, LLP.

(57) ABSTRACT

The display device having a thin film transistor formed on a substrate including a display portion is provided. The thin film transistor including: a gate electrode; a gate insulating film formed so as to cover the gate electrode; a semiconductor laminated film formed on top the gate insulating film so as to extend over the gate electrode, the semiconductor laminated film being formed by laminating at least a polycrystalline semiconductor film and an amorphous semiconductor film, a first electrode and a second electrode disposed on top of the semiconductor laminated film so as to be opposed to each other across a region superposing the gate electrode. In the display device, the semiconductor laminated film is formed immediately below a wiring extending from the first electrode and immediately below a wiring extending from the second electrode.

2 Claims, 13 Drawing Sheets

DISPLAY DEVICE AND METHOD OF MANUFACTURING THE SAME

CROSS-REFERENCE TO RELATED APPLICATION

The present application claims priority from Japanese application JP 2008-276287 filed on Oct. 28, 2008, the content of which is hereby incorporated by reference into this application.

BACKGROUND OF THE INVENTION

1. Field of the Invention

The present invention relates to a display device and a method of manufacturing the same. More particularly, the present invention relates to a display device having thin film transistors formed on a display substrate thereof and a method of manufacturing the same.

2. Description of the Related Art

For example, in an organic electroluminescence (EL) device, pixels are arranged in matrix on a display substrate of the device, and each of the pixels includes an organic EL element. Light emissions by the organic EL elements themselves display an image.

Further, a plurality of pixels arranged in a row direction, for example, are selected in sequence in a column direction. In synchronization with the timing of the selection, a signal (video signal) is supplied through a signal line (drain line) formed in common to a plurality of pixels arranged in the column direction, and the respective pixels are driven by current corresponding to the signal flowing into the organic EL elements.

Therefore, each of the pixels includes at least a switching element for selecting the plurality of pixels arranged in the row direction and a current control element for allowing current corresponding to the video signal to flow into the organic EL element. Both of the switching element and the current control element are formed by a thin film transistor having a metal insulator semiconductor (MIS) structure.

As a structure of such a thin film transistor, there is known one disclosed in, for example, Japanese Patent Application Laid-Open No. 2005-167051, and a sectional view thereof is illustrated in FIG. 2. It is to be noted that the view of FIG. 2 corresponds to the view of FIG. 1B illustrating an embodiment of the present invention, and hence description of FIG. 2 is limited to schematic description. The detailed structure of FIG. 2 is to be referenced by the description related to FIG. 1B.

In FIG. 2, a thin film transistor (TFT) has a so-called bottom gate structure. Specifically, on a gate insulating film 12 covering a gate electrode 11, a laminate (semiconductor laminated film 16) formed by laminating in sequence a polycrystalline semiconductor film 13, an amorphous semiconductor film 14, and an amorphous semiconductor film heavily doped with impurities (heavily doped amorphous semiconductor film) 15 is formed on the gate insulating film 12 in an island-like manner. A drain electrode 17 and a source electrode 18 are formed on top of the semiconductor laminated film 16. In this case, the heavily doped amorphous semiconductor film 15 between the drain electrode 17 and the source electrode 18 is removed to such an extent that the amorphous semiconductor film 14 is exposed so as to function as an ohmic contact layer. The drain electrode 17 and the source electrode 18 each are formed so as to extend to outer peripheral portions of the semiconductor laminated film 16 along side-wall surfaces of the island-like semiconductor laminated film 16.

It is to be noted that a drain electrode and a source electrode of the thin film transistor (TFT) operate interchangingly depending on a bias application state. However, in this specification, for the sake of simplicity of the description, a left electrode in the drawing is referred to as a drain electrode while a right electrode in the drawing is referred to as a source electrode. There may be a case where one of the drain electrode and the source electrode is referred to as a first electrode, whereas another one is referred to as a second electrode.

Further, T. Kaitoh et al., "SELAX Technology for Poly-Si TFTs Integrated with Amorphous-Si TFTs", pp. 481, International Display Workshop 2007 discloses a structure of a thin film transistor (TFT) as illustrated in FIG. 3. The view of FIG. 3 corresponds to the view of FIG. 2. In FIG. 3, the structure is different from that illustrated in FIG. 2 in that the heavily doped amorphous semiconductor film 15 is not only formed on a surface of the amorphous semiconductor film 14 but also extends to outer peripheral portions of the semiconductor laminated film along side-wall surfaces of an island-like semiconductor laminated film (amorphous semiconductor film 14 and the polycrystalline semiconductor film 13), and in that the drain electrode 17 and the source electrode 18 are formed superimposingly on the heavily doped amorphous semiconductor film 15.

SUMMARY OF THE INVENTION

In the thin film transistor (TFT) described with reference to FIG. 2, at an interface between the gate insulating film 12 and the semiconductor film where a channel is formed, the semiconductor film is formed as the polycrystalline semiconductor film 13. Therefore, the thin film transistor (TFT) has a satisfactory sub-threshold swing (S) value and satisfactory reliability, and, by hydrogen supplied from the amorphous semiconductor film 14, the TFT transistor may reduce leakage current. However, it is indicated that, in an off state, leakage current occurs between the drain electrode 17 and the source electrode 18. This is thought to be caused that the polycrystalline semiconductor film 13 exposed at the side-wall surfaces of the semiconductor laminated film 16 contacts the drain electrode 17 and the source electrode 18.

On the other hand, in the thin film transistor (TFT) described with reference to FIG. 3, the drain electrode 17 and the source electrode 18 are not in direct contact with the polycrystalline semiconductor film 13, and thus, occurrence of the leakage current in an off state can be reduced. However, it is indicated that the current fluctuates at a low gate voltage. This is thought to be caused by such a reason that, while a main current path in an on state is from the heavily doped amorphous semiconductor film 15 through the non-doped amorphous semiconductor film 14, the polycrystalline semiconductor film 13, and the non-doped amorphous semiconductor film 14 to the heavily doped amorphous semiconductor film 15, current begins to flow at a lower gate voltage than along the above-mentioned current path, along a current path from the heavily doped amorphous semiconductor film 15 through the polycrystalline semiconductor film 13 to the heavily doped amorphous semiconductor film 15.

Accordingly, an object of the present invention is to provide a display device having a thin film transistor with which leakage current is small and variations in the characteristics are small.

Another object of the present invention is to provide a method of manufacturing a display device which can reduce the number of the manufacturing steps.

According to the present invention, by forming a thin film transistor of a display device such that a semiconductor laminated film is formed immediately below a wiring extending from a drain electrode and immediately below a wiring extending from a source electrode, a polycrystalline semiconductor layer or a non-doped amorphous semiconductor film in the semiconductor laminated film is prevented from being electrically connected to the wiring extending from the drain electrode and the wiring extending from the source electrode.

The structure of the present invention may be, for example, as follows.

(1) A display device of the present invention is a display device having a thin film transistor formed on a substrate including a display portion, the thin film transistor including:

a gate electrode;

a gate insulating film formed so as to cover the gate electrode;

a semiconductor laminated film formed on top the gate insulating film so as to extend over the gate electrode, the semiconductor laminated film being formed by laminating at least a polycrystalline semiconductor film and an amorphous semiconductor film, a first electrode and a second electrode disposed on top of the semiconductor laminated film so as to be opposed to each other and across a region superposing the gate electrode, in which the semiconductor laminated film is formed immediately below a wiring extending from the first electrode and immediately below a wiring extending from the second electrode.

(2) In a display device according to item (1), the display portion includes a plurality of pixels, and the thin film transistor is formed in a region of each of the plurality of pixels.

(3) In a display device according to item (1), the display portion includes a plurality of pixels, the substrate includes a drive circuit for driving the plurality of pixels, the drive circuit being adjacent to the display portion, and the thin film transistor is formed in the drive circuit.

(4) A display device of the present invention is a display device having a thin film transistor formed on a substrate including a display portion, the thin film transistor including:

a gate electrode;

a gate insulating film formed so as to cover the gate electrode;

a semiconductor laminated film formed on top of the gate insulating film so as to extend over the gate electrode, the semiconductor laminated film being formed by laminating at least a polycrystalline semiconductor film, an amorphous semiconductor film, and a heavily doped amorphous semiconductor film in sequence; and a first electrode and a second electrode disposed on top of the semiconductor laminated film so as to be opposed to each other across a region superposing the gate electrode, in which:

the heavily doped amorphous semiconductor film between the first electrode and the second electrode is removed to such an extent that the amorphous semiconductor film thereunder is exposed; and the semiconductor laminated film is formed immediately below a wiring extending from the first electrode and immediately below a wiring extending from the second electrode.

(5) In a display device according to item (4), the display portion includes a plurality of pixels, and the thin film transistor is formed in a region of each of the plurality of pixels.

(6) In a display device according to item (4), the display portion includes a plurality of pixels, the substrate includes a drive circuit for driving the plurality of pixels, the drive circuit being adjacent to the display portion, and the thin film transistor is formed in the drive circuit.

(7) A manufacturing method for a display device according to the present invention is a method of manufacturing a display device having a thin film transistor formed on a substrate including a display portion, in which the thin film transistor is manufactured by the following steps of:

forming a gate insulating film so as to cover at least a gate electrode;

forming on top of the gate insulating film at least a polycrystalline semiconductor film, an amorphous semiconductor film, a heavily doped amorphous semiconductor film, and a metal film in sequence;

forming on the metal film a photoresist film so that a film thickness of the photoresist film in a region between a first electrode and a second electrode is smaller than the film thickness of the photoresist film in regions where the first electrode, a wiring extending from the first electrode, the second electrode, and a wiring extending from the second electrode are to be formed;

etching the metal film, the heavily doped amorphous semiconductor film, the amorphous semiconductor film, and the polycrystalline semiconductor film in sequence by using the photoresist film as a mask;

forming an opening in the region between the first electrode and the second electrode for forming the thin film transistor by ashing the photoresist film; and etching the metal film and the heavily doped amorphous semiconductor film by using the photoresist film having the opening as a mask to such an extent that the amorphous semiconductor film thereunder is exposed.

(8) In a method of manufacturing a display device according to item (7), the photoresist film having the small thickness region and the large thickness regions is formed by exposure using a half-tone mask.

(9) In a method of manufacturing a display device according to item (7), the photoresist film having the small thickness region and the large thickness regions is formed by exposure using a gray-tone mask.

It is to be noted that the above-described structures are only exemplary and the present invention may be modified or changed within the technical philosophy thereof. Further, examples of the structures according to the present invention other than the above-described structures will become apparent from the description of the whole specification or drawings of the present application.

A display device structured as described above has a thin film transistor with which leakage current is small and variations in the characteristics are small.

Further, a method of manufacturing a display device structured as described above can reduce the number of the manufacturing steps.

Other effects of the present invention will become apparent from the description of the whole specification.

DETAILED DESCRIPTION OF THE INVENTION

Embodiments of the present invention are now described with reference to the attached drawings. It is to be noted that, throughout the drawings and the embodiments, the same reference symbols are used to designate identical or similar members and description thereof is omitted.

Embodiment 1

Figure 20:
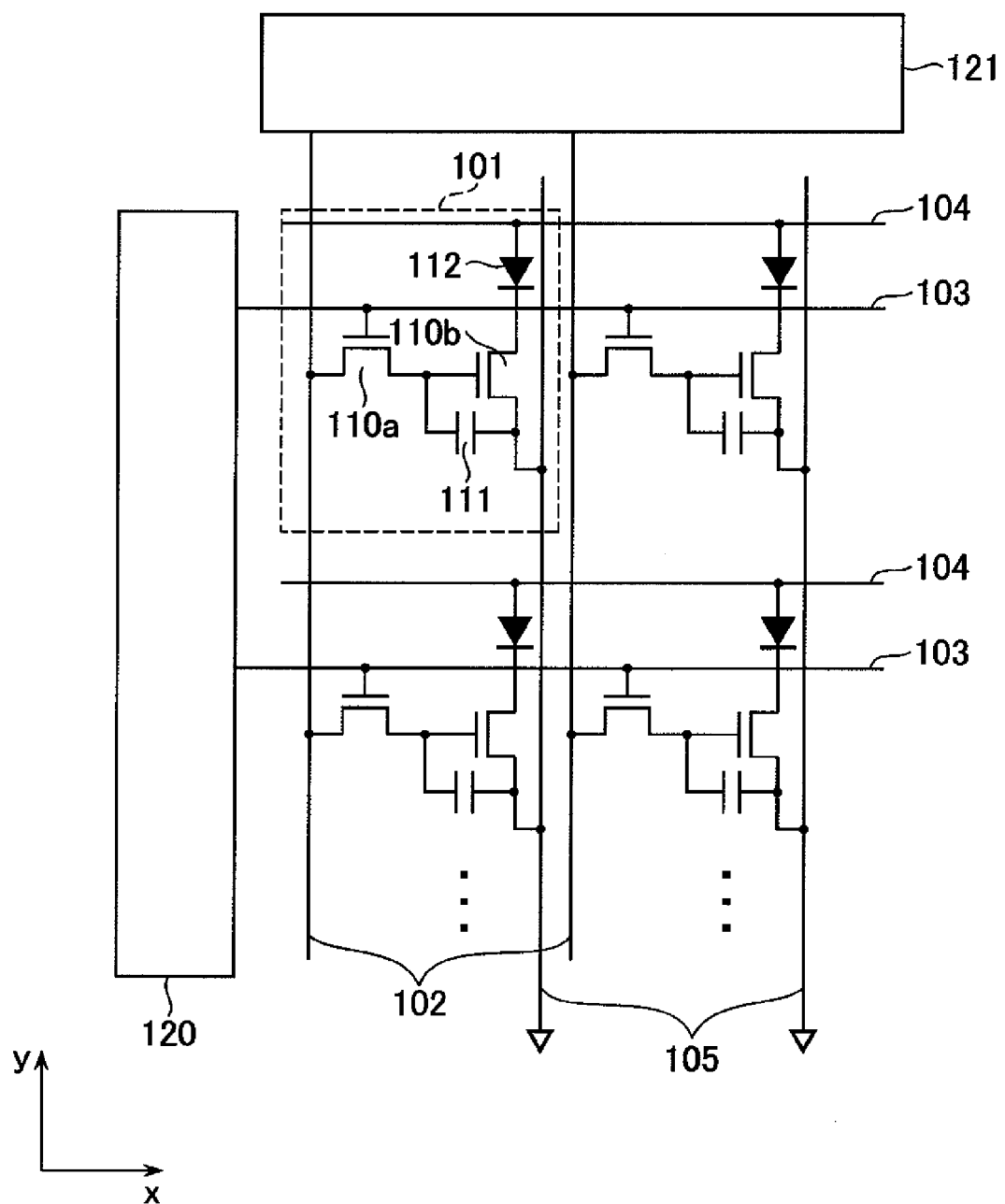
FIG. 20 is a circuit diagram of an embodiment of an equivalent circuit of the organic EL display device as the display device according to the present invention.

FIG. 20 schematically illustrates a circuit of an organic EL display device as an exemplary display device of the present invention.

In FIG. 20, gate lines 103 are formed so as to extend in an x direction of FIG. 20 and so as to be arranged in a y direction of FIG. 20 in parallel with one another. Each of the gate lines 103 is connected on one end side thereof to a gate driver 120 so as to be supplied with a scan signal in sequence. Further, power supply lines 104 are formed so as to extend in the x direction of FIG. 20 adjacently to the gate lines 103, respectively, and so as to be arranged in the y direction of FIG. 20 in parallel with one another. Further, drain lines 102 are formed so as to extend in the y direction of FIG. 20 and so as to be arranged in the x direction of FIG. 20 in parallel with one another. Each of the drain lines 102 is connected on one end side thereof to a drain driver 121 so as to be supplied with a video signal. Further, common lines 105 are formed so as to extend in the y direction of FIG. 20 adjacently to the drain lines 102, respectively, and so as to be arranged in the x direction of FIG. 20 in parallel with one another.

A region surrounded by dotted lines of FIG. 20 is a region of a pixel 101. A display region is formed of an aggregation of a plurality of pixels 101 which are arranged in matrix. A switching element 110a, an auxiliary capacitor 111, a current control element 110b, and an organic EL element 112 are formed in the region of the pixel 101. Supply of a scan signal from the gate line 103 turns on the switching element 110a, charge is accumulated on the auxiliary capacitor 111, and the charge controls current flowing through the current control element 110b. The current flows through the power supply line 104, the organic EL element 112, the current control element 110b, and the common line 105. The organic EL element 112 is adapted to emit light with the brightness of the light corresponding to the value of the current.

It is to be noted that the gate driver 120 and the drain driver 121 may be formed on a substrate having the pixels 101 formed thereon, or may be formed as an external LSI chip.

Figure 1A:
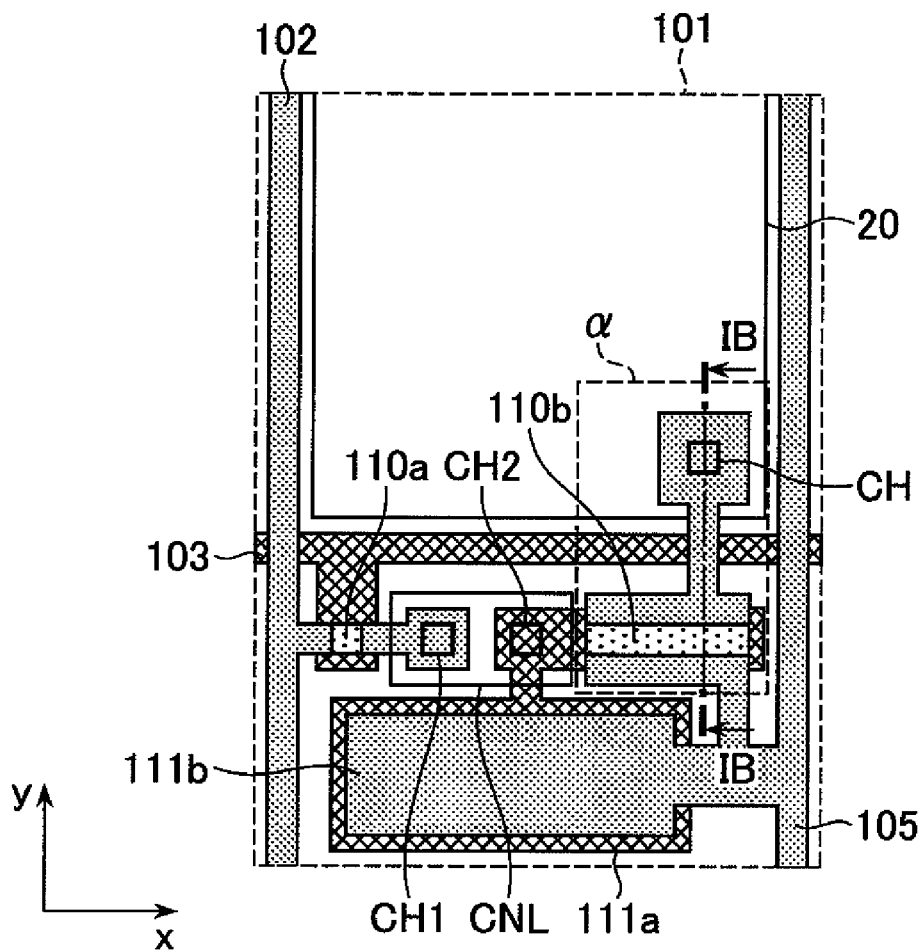
FIGS. 1A and 1B illustrate an embodiment of a structure of a pixel of an organic EL display device as a display device according to the present invention.
Figure 1B:
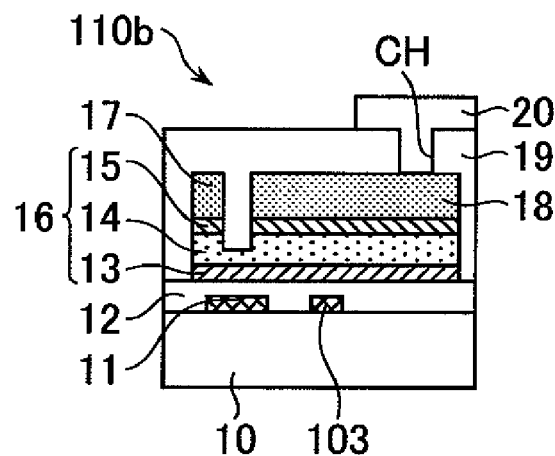
Figure 2:
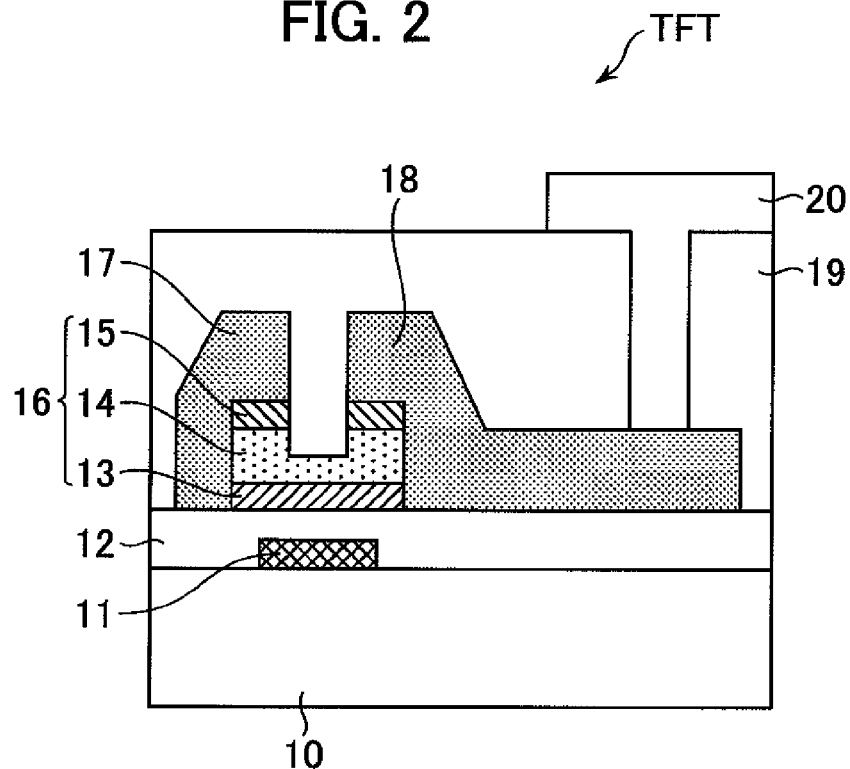
FIG. 2 is a sectional view of an exemplary thin film transistor formed in a conventional display device.
Figure 3:
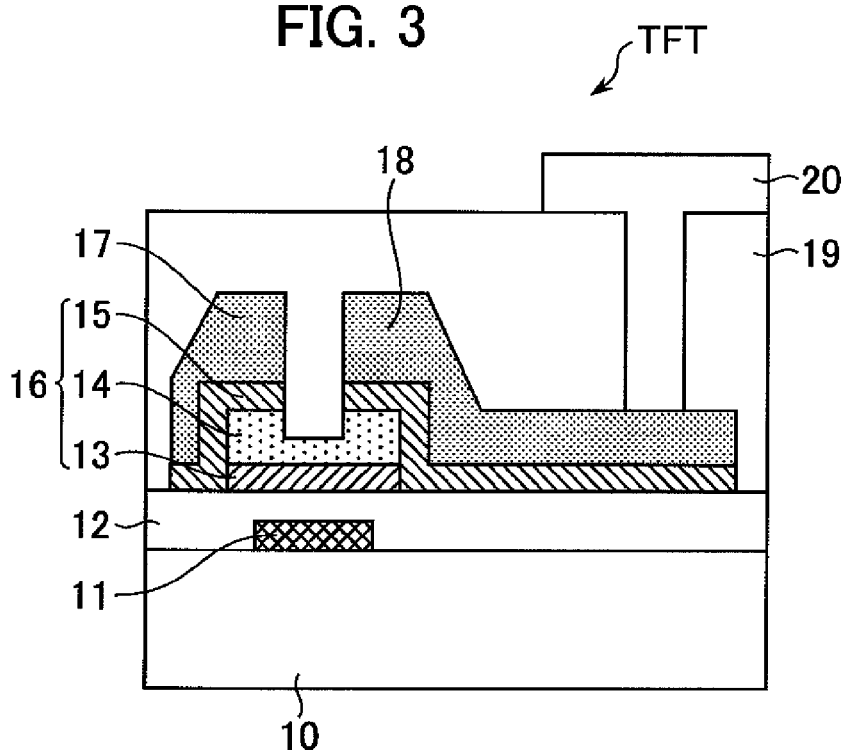
FIG. 3 is a sectional view of another exemplary thin film transistor formed in a conventional display device.

FIG. 1A is a plan view specifically illustrating the structure of the pixel 101 formed on the substrate. In FIG. 1A, a hole transportation layer, a light emitting layer, an electron transportation layer, and a cathode electrode formed so as to be laminated on a pixel electrode 20 illustrated in FIG. 1A are omitted, and thus, the organic EL element 112 and the power supply line 104 in FIG. 20 are not illustrated. FIG. 1B is a sectional view taken along the line IB-IB of FIG. 1A.

In FIGS. 1A and 1B, the gate line 103, a gate electrode of the switching element 110a integrally formed with the gate line 103, an electrode 111a of the auxiliary capacitor 111, and a gate electrode of the current control element 110b integrally formed with the electrode 111a are each formed by a metal film on a substrate 10. A gate insulating film 12 is formed so as to cover the metal films. A semiconductor laminated film 16 including a polycrystalline semiconductor film 13, a non-doped amorphous semiconductor film 14, and a heavily doped amorphous semiconductor film 15 laminated in sequence is formed on top of the gate insulating film 12.

The semiconductor laminated film 16 is formed not only in a region in which the switching element 110a and the current control element 110b as thin film transistors are formed but also under the wiring extending from drain electrodes and source electrodes of the switching element 110a and the current control element 110b. The wiring includes the drain line 102, the common line 105, the other electrode 111b of the auxiliary capacitor 111, and the like. This is because, as is clear from description of a manufacturing method in the following, the semiconductor laminated film 16 is formed by carrying out etching with a photoresist film as a mask, which is used in forming the drain line 102, the common line 105, the other electrode 111b of the auxiliary capacitor, and the like on the semiconductor laminated film 16.

In this way, as illustrated in FIG. 1B, the semiconductor laminated film 16 is definitely formed under the metal film as the drain line 102, the common line 105, and the like. The semiconductor laminated film 16 is formed by laminating the polycrystalline semiconductor film 13, the non-doped amorphous semiconductor film 14, and the heavily doped amorphous semiconductor film 15 in sequence. Therefore, electric contact between the metal films and the polycrystalline semiconductor film 13 can be avoided, and electric contact between the heavily doped amorphous semiconductor film 15 and the polycrystalline semiconductor film 13 can be avoided. Therefore, for example, leakage current in the current control element 110b can be significantly reduced, and fluctuations in current at low gate voltage can be suppressed. The switching element 110a also has a similar structure.

It is to be noted that, as illustrated in FIG. 1B, in a channel region between a drain electrode 17 and a source electrode 18 of the current control element 110b, the heavily doped amorphous semiconductor film 15 is completely etched away, and the non-doped amorphous semiconductor film 14 is etched so as to have a slight recess. This etching electrically isolates the drain electrode 17 and the source electrode 18.

An interlayer insulating film 19 formed of a silicon oxynitride film is formed by plasma CVD on the substrate 10 so as to cover the switching element 110a, the current control element 110b, and the like. A pixel electrode 20 formed of a transparent conductive film including, for example, indium tin oxide (ITO) is formed on top of the interlayer insulating film 19. The pixel electrode 20 is connected to the source electrode 18 of the current control element 110b via a contact hole CH formed in advance in the interlayer insulating film 19.

It is to be noted that a conductive film CNL is formed on the interlayer insulating film 19 simultaneously with the formation of the pixel electrode 20. The source electrode of the switching element 110*a* connected to the conductive film CNL via a contact hole CH1 formed in the interlayer insulating film 19 and the gate electrode 11 of the current control element 110*b* connected to the conductive film CNL via contact hole CH2 formed in the interlayer insulating film 19 and the gate insulating film 12 are electrically connected.

Next, a method of manufacturing the display device is described. FIGS. 4A to 11B illustrate manufacturing steps of an embodiment of a method of manufacturing the display device according to the present invention. Among these figures, figures ending with A are plan views illustrating a portion α surrounded by dotted lines of FIG. 1A while figures ending with B are sectional views (sectional views taken along the alternate long and short dashed lines in the plan views, respectively). In the following, description is made in the order of the manufacturing steps.

Figure 4A:
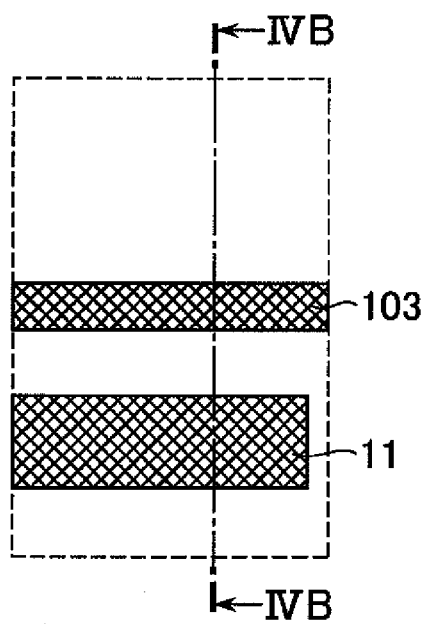
FIGS. 4A to 11B illustrate manufacturing steps of an embodiment of a method of manufacturing the display device according to the present invention.
Figure 4B:
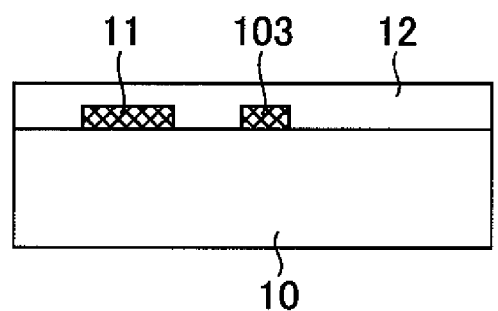

In a first step illustrated in FIGS. 4A and 4B, first, a substrate 10 made of glass is prepared and, for example, a tungsten film is formed on the substrate 10 by sputtering. The gate line 103 and the gate electrode 11 are formed by selective etching using known photolithography (first photolithography step). Further, the gate insulating film 12 formed by laminating a silicon nitride film and a silicon oxide film in sequence is formed on the substrate 10 so as to cover the gate line 103 and the like. The silicon nitride film functions as an alkali ion barrier while the silicon oxide film makes a satisfactory condition of the interface with the semiconductor layer to be formed later.

Figure 5A:
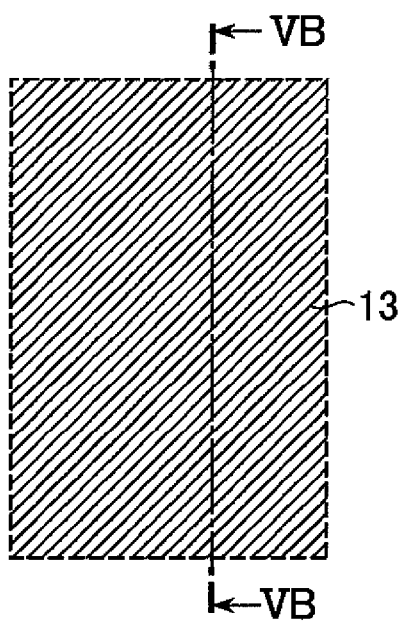
Figure 5B:
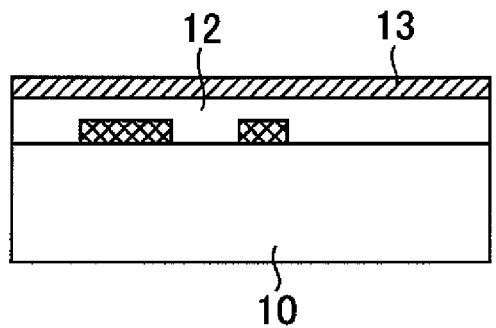

In a second step illustrated in FIGS. 5A and 5B, the polycrystalline semiconductor film 13 is formed on the gate insulating film 12. The polycrystalline semiconductor film 13 is obtained by, for example, crystallizing by annealing a precursor film formed of an amorphous silicon film by plasma CVD. In this case, by using a polycrystal having a grain size of 100 nm or less, fluctuations in characteristics can be made small and an image with less roughness can be obtained.

Figure 6A:
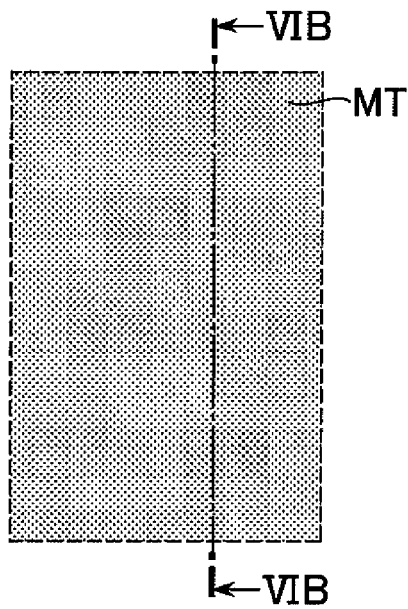
Figure 6B:
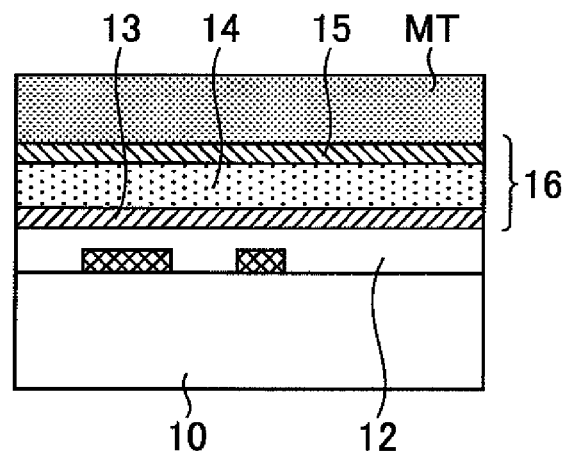

After the polycrystalline semiconductor film 13 is formed, in a third step illustrated in FIGS. 6A and 6B, the non-doped amorphous semiconductor film 14 and the heavily doped amorphous semiconductor film 15 are formed in sequence by plasma CVD to form the semiconductor laminated film 16. Further, a metal film MT made of, for example, tungsten is formed on the semiconductor laminated film 16 by sputtering.

Figure 7A:
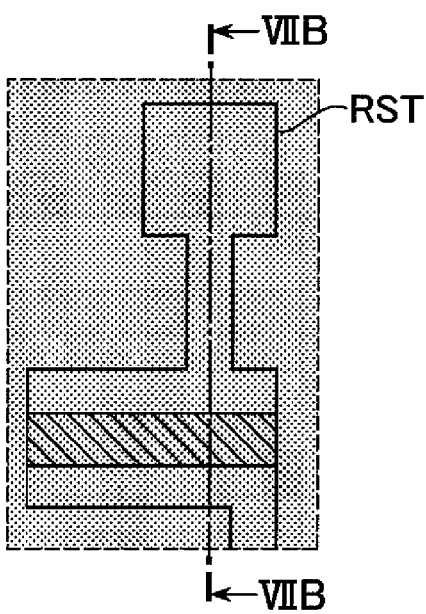
Figure 7B:
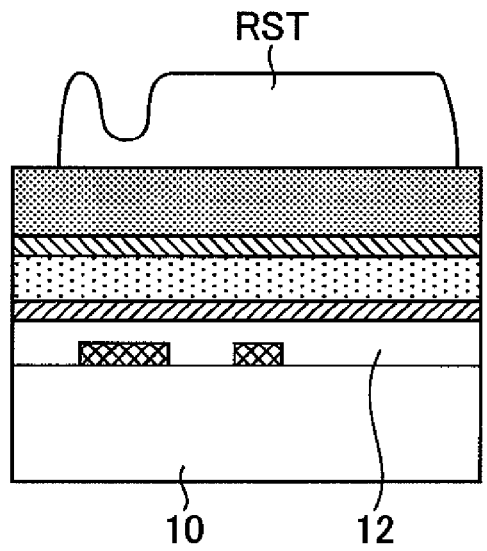

In a fourth step illustrated in FIGS. 7A and 7B, a photoresist is applied on the metal film MT and a photoresist film RST to be a mask for selectively etching the metal film MT is formed (second photolithography step). In this case, by photolithography technique of exposure using a so-called half-tone mask or gray-tone mask, a part having a smaller film thickness is formed in the photoresist film RST at a portion which corresponds to the channel region of the thin film transistor (shown as a diagonally shaded area in FIG. 7A).

Figure 8A:
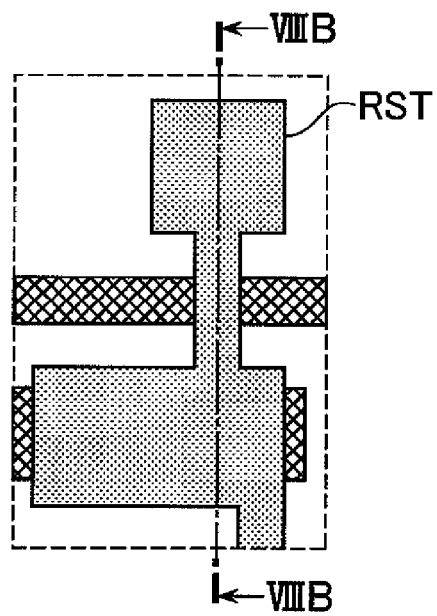
Figure 8B:
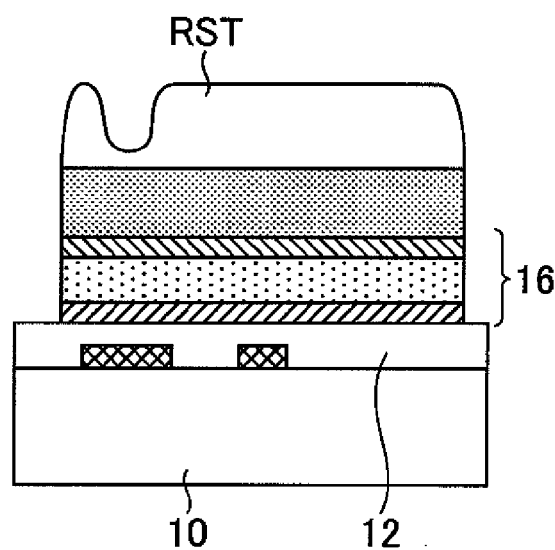

In a fifth step illustrated in FIGS. 8A and 8B, the metal film MT exposed below the photoresist film RST is etched with the photoresist film RST being used as a mask. Further, the semiconductor laminated film 16 exposed by etching the metal film MT is etched in sequence. In this step, the drain electrode and the source electrode of the thin film transistor are connected to each other above the channel region.

Figure 9A:
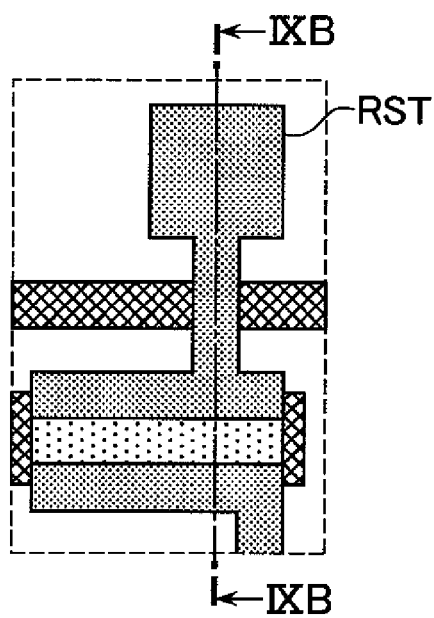
Figure 9B:
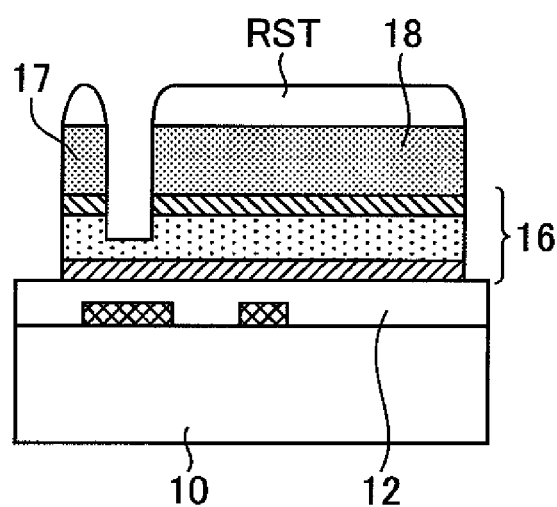

In a sixth step illustrated in FIGS. 9A and 9B, the photoresist film RST is ashed to evenly decrease the thickness of the photoresist film RST. As a result, an opening is formed in the portion which corresponds to the channel region of the thin film transistor to expose the metal film. The photoresist film RST remains at portions which correspond to regions of the thin film transistor in which the drain electrode and the source electrode are formed.

With the ashed photoresist film RST being used as a mask, the metal film MT and the heavily doped amorphous semiconductor film 15 at the portion which corresponds to the channel region of the thin film transistor are etched in sequence, and further, the non-doped amorphous semiconductor film 14 is etched such that a recess is formed in its surface. This etching is referred to as so-called back-channel etching and is carried out such that the drain electrode 17 and the source electrode 18 of the thin film transistor are electrically isolated from each other.

In such a structure, the semiconductor laminated film 16 is definitely formed under the metal film MT as the drain electrode 17, the source electrode 18, and the like. The semiconductor laminated film 16 is formed by laminating the polycrystalline semiconductor film 13, the non-doped amorphous semiconductor film 14, and the heavily doped amorphous semiconductor film 15 in sequence. Therefore, electric contact between the metal film MT and the polycrystalline semiconductor film 13 can be avoided, and electric contact between the heavily doped amorphous semiconductor film 15 and the polycrystalline semiconductor film 13 can be avoided, and thus, leakage current can be significantly reduced and fluctuations in current at low gate voltage can be suppressed.

Figure 10A:
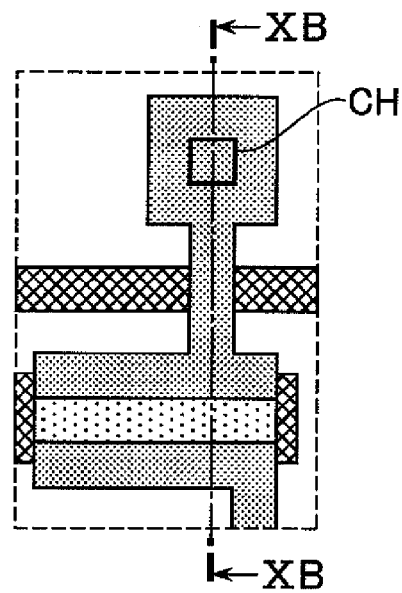
Figure 10B:
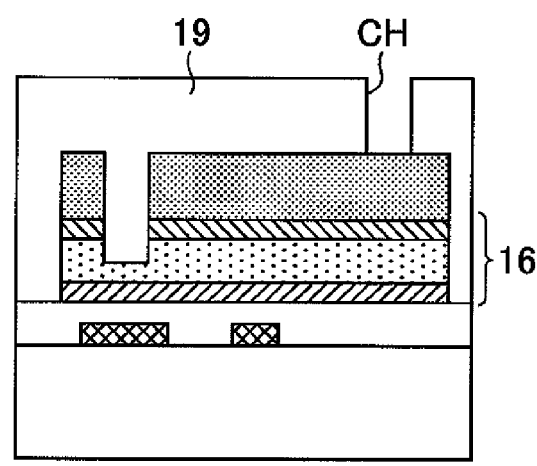

In a seventh step illustrated in FIGS. 10A and 10B, the interlayer insulating film 19 formed of a silicon oxynitride film is formed by plasma CVD on the substrate 10 processed as described above so as to cover the metal film and the like. Then, the contact hole CH is formed in the interlayer insulating film 19 using photolithography (third photolithography step).

Figure 11A:
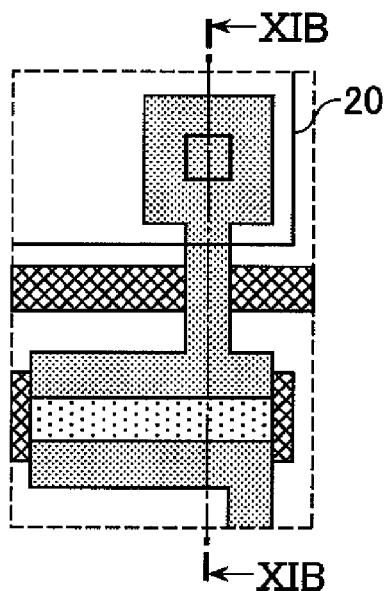
Figure 11B:
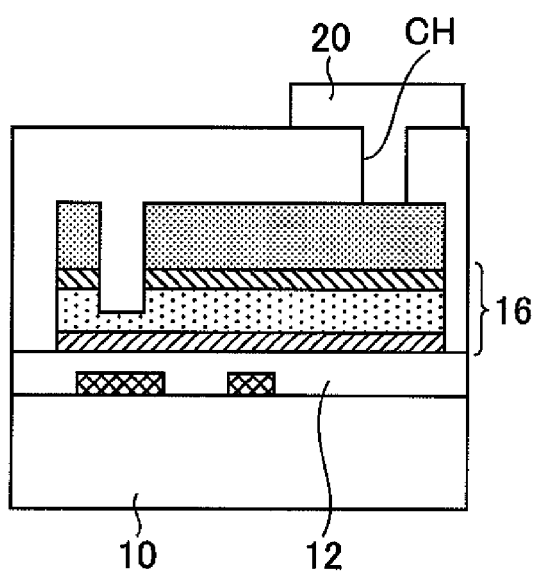

In an eighth step illustrated in FIGS. 11A and 11B, the transparent conductive film formed of, for example, indium tin oxide (ITO) is formed on the interlayer insulating film 19 so as to cover the contact hole CH. Then, the transparent conductive film is selectively etched using photolithography (fourth photolithography step) to form the pixel electrode 20. The pixel electrode 20 is electrically connected to the source electrode 18 of the thin film transistor via the contact hole CH.

As described above, only four photolithography steps are necessary in the manufacturing method, and the number of the manufacturing steps can be reduced.

After that, though not shown in the figures, the display device is completed through the following steps. More specifically, the organic EL element (denoted by 112 in FIG. 20) is formed by laminating the hole transportation layer, the light emitting layer, the electron transportation layer, and the cathode electrode sequentially on the pixel electrode 20. A sealing material is disposed around the substrate so as to surround the display region having a plurality of organic EL elements formed therein, and sealing is carried out using a sealing substrate or a sealing can. In other case, the sealing substrate or the sealing can may not be used, and a protective film may be applied or a protective film may be directly formed by vapor deposition.

A display signal from an external signal source is supplied via a printed board to the substrate structured in this way. The display signal is adapted to drive a drive circuit formed on the substrate.

Embodiment 2

FIGS. 12A to 19B illustrate manufacturing steps of Embodiment 2 of the method of manufacturing a display device according to the present invention and correspond to FIGS. 4A to 11B, respectively.

In the manufacturing method of Embodiment 2, photolithography is carried out without using a so-called half-tone mask or gray-tone mask. In the following, description is made in the order of the manufacturing steps.

Figure 12A:
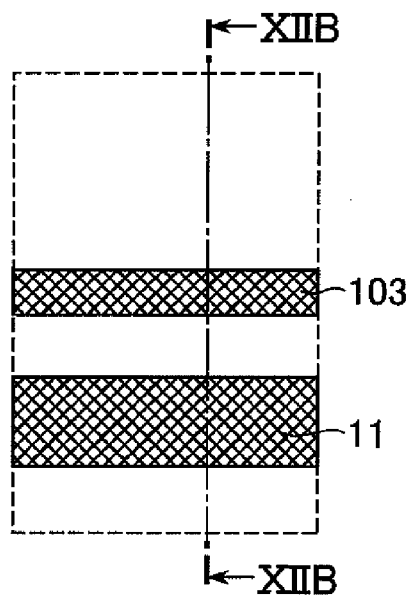
FIGS. 12A to 19B illustrate manufacturing steps of another embodiment of a method of manufacturing the display device according to the present invention.
Figure 12B:
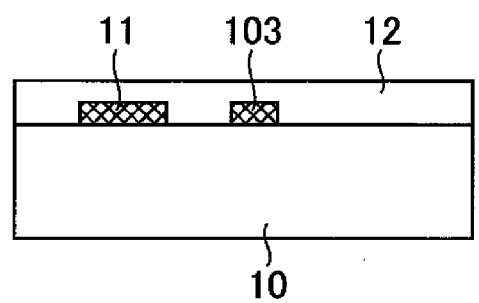

In a first step illustrated in FIGS. 12A and 12B, first, the substrate 10 made of glass is prepared and, for example, a tungsten film is formed on the substrate 10 by sputtering. The gate line 103 and the gate electrode 11 are formed by selective etching using known photolithography (first photolithography step). Further, the gate insulating film 12 formed by laminating a silicon nitride film and a silicon oxide film in sequence is formed on the substrate 10 so as to cover the gate line 103 and the like. The silicon nitride film functions as an alkali ion barrier while the silicon oxide film makes a satisfactory condition of the interface with the semiconductor layer to be formed later.

Figure 13A:
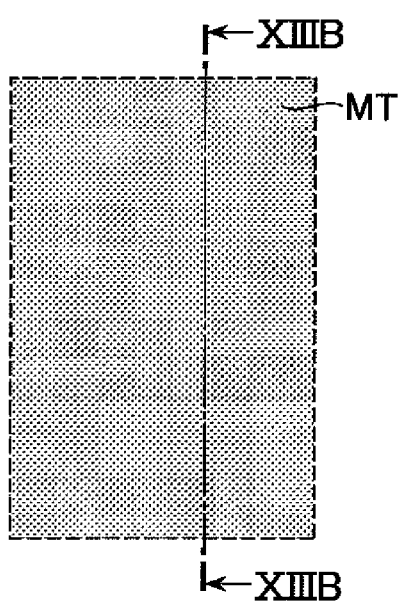
Figure 13B:
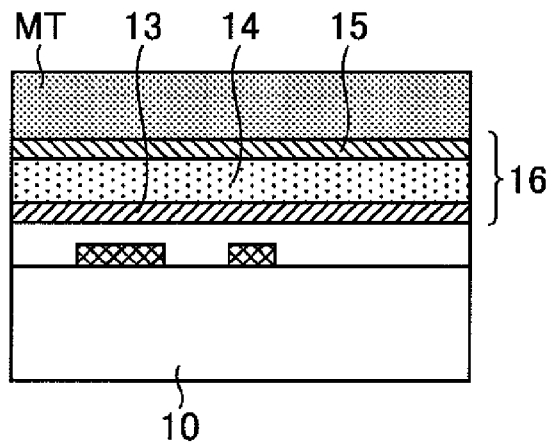

In a second step illustrated in FIGS. 13A and 13B, the polycrystalline semiconductor film 13 made of, for example, polycrystalline silicon is formed on the gate insulating film 12. The polycrystalline semiconductor film 13 is obtained by, for example, crystallizing by annealing a precursor film formed of an amorphous silicon film by plasma CVD. In this case, by using a polycrystal having a grain size of 100 nm or less, fluctuations in characteristics can be made small and an image with less roughness can be obtained. After the polycrystalline semiconductor film 13 is formed, the non-doped amorphous semiconductor film 14 and the heavily doped amorphous semiconductor film 15 are formed in sequence by plasma CVD to form the semiconductor laminated film 16. Further, a metal film MT made of, for example, tungsten is formed on the semiconductor laminated film 16 by sputtering.

Figure 14A:
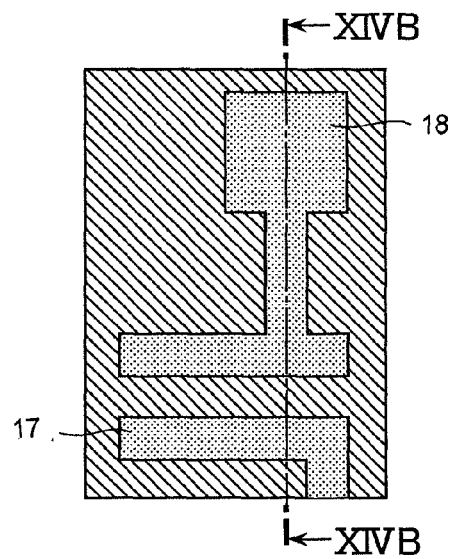
Figure 14B:
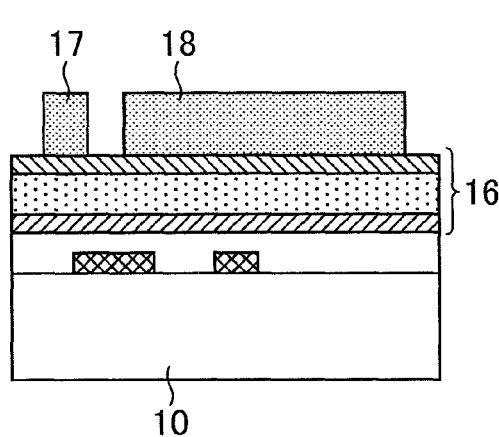

In a third step illustrated in FIGS. 14A and 14B, a photoresist film (not shown) patterned by photolithography is formed on the metal film MT (second photolithography step). The metal film MT is etched with the photoresist film being used as a mask to form the drain electrode 17 and the source electrode 18 of the thin film transistor.

Figure 15A:
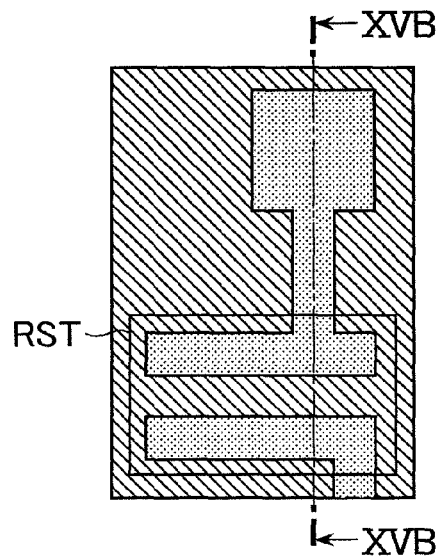
Figure 15B:
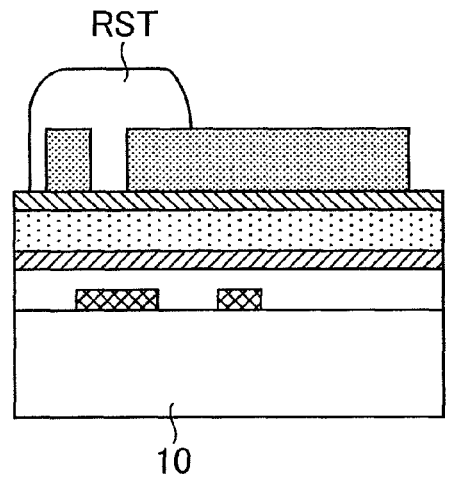

In a fourth step illustrated in FIGS. 15A and 15B, a photoresist film RST patterned so as to cover the drain electrode 17 and the source electrode 18 is formed by photolithography (third photolithography step). Wiring formed so as to extend from the drain electrode 17 and the wiring formed so as to extend from the source electrode 18 are adapted to be exposed from the photoresist film RST. More specifically, the patterned photoresist film RST corresponds to a region in which the semiconductor layer (semiconductor laminated film 16) of the thin film transistor is formed.

Figure 16A:
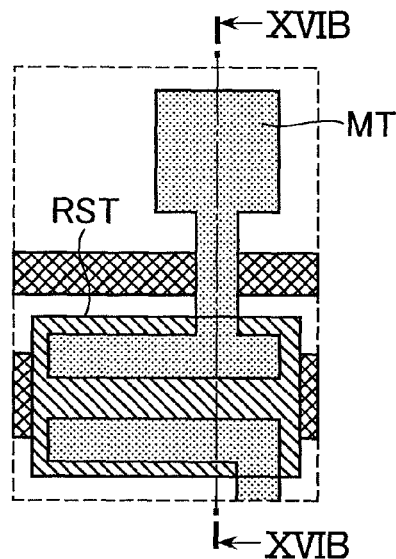
Figure 16B:
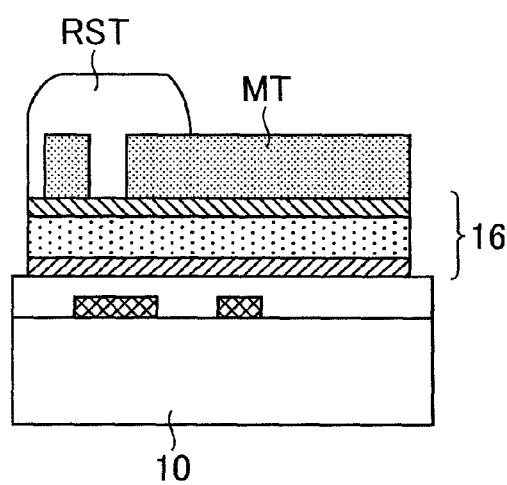

In a fifth step illustrated in FIGS. 16A and 16B, the heavily doped amorphous semiconductor film 15, the non-doped amorphous semiconductor film 14, and the polycrystalline semiconductor film 13 are etched in sequence with the photoresist film RST and the metal film MT exposed from the photoresist film RST being used as masks to leave the semiconductor layer (semiconductor laminated film 16) of the thin film transistor. In this case, the heavily doped amorphous semiconductor film 15, the non-doped amorphous semiconductor film 14, and the polycrystalline semiconductor film 13 are made to remain not only immediately below the semiconductor laminated film 16 of the thin film transistor but also immediately below the metal film MT.

Therefore, in such a structure, the semiconductor laminated film 16 is definitely formed under the metal film MT as the drain electrode 17, the source electrode 18, and the like. The semiconductor laminated film 16 is formed by laminating the polycrystalline semiconductor film 13, the non-doped amorphous semiconductor film 14, and the heavily doped amorphous semiconductor film 15 in sequence. Therefore, electric contact between the metal film MT and the polycrystalline semiconductor film 13 can be avoided, and electric contact between the heavily doped amorphous semiconductor film 15 and the polycrystalline semiconductor film 13 can be avoided, and thus, leakage current can be significantly reduced and fluctuations in current at low gate voltage can be suppressed.

Figure 17A:
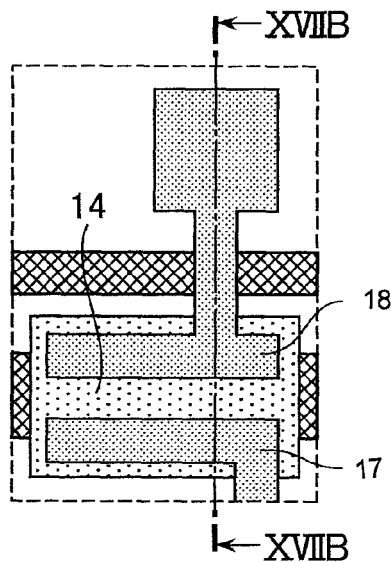
Figure 17B:
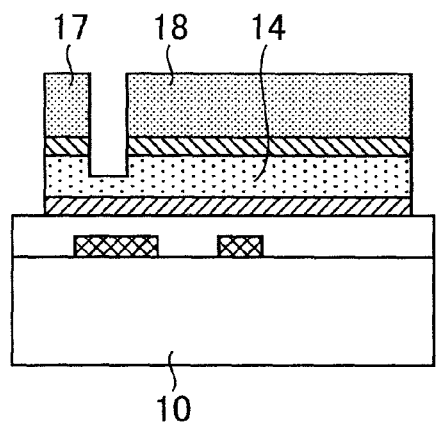

In a sixth step illustrated in FIGS. 17A and 17B, the photoresist film RST is removed, the heavily doped amorphous semiconductor film 15 exposed from the metal film MT is etched, and further, the non-doped amorphous semiconductor film 14 is etched such that a recess is formed in its surface. This etching is referred to as so-called back-channel etching and is carried out such that the drain electrode 17 and the source electrode 18 of the thin film transistor are electrically isolated from each other.

Figure 18A:
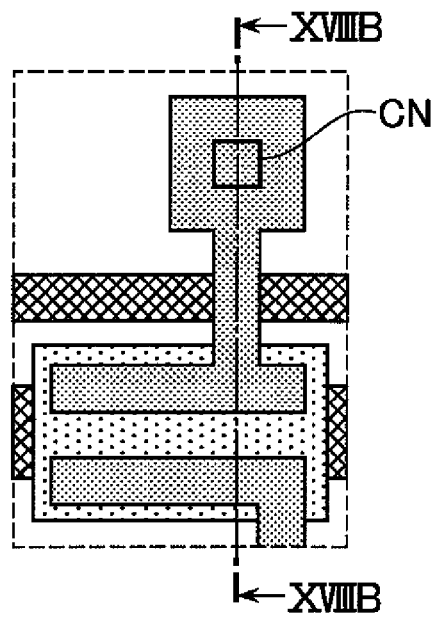
Figure 18B:
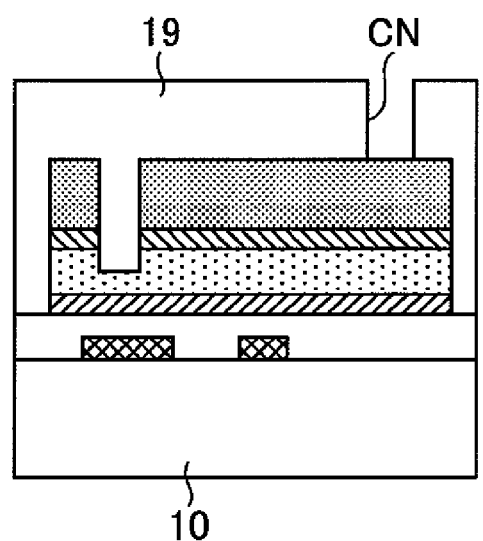

In a seventh step illustrated in FIGS. 18A and 18B, the interlayer insulating film 19 formed of a silicon oxynitride film is formed by plasma CVD on the substrate 10 processed as described above so as to cover the metal film MT and the like. Then, the contact hole CH is formed in the interlayer insulating film 19 using photolithography (fourth photolithography step).

Figure 19A:
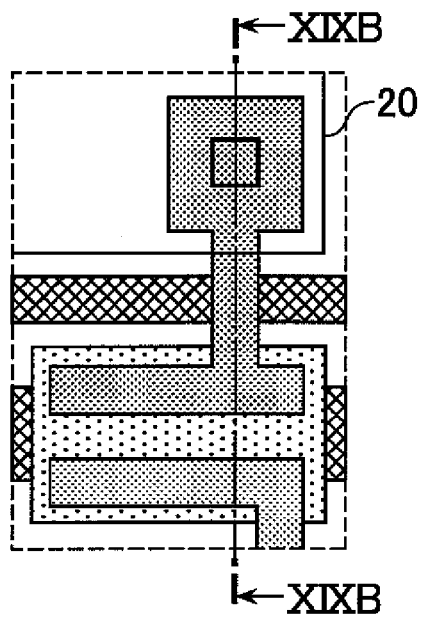
Figure 19B:
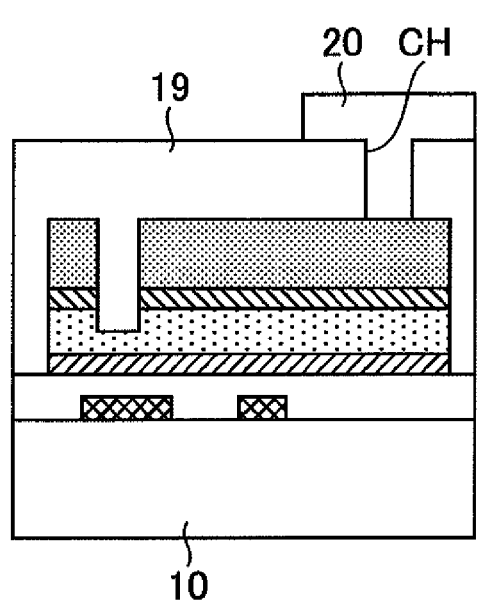

In an eighth step illustrated in FIGS. 19A and 19B, the transparent conductive film formed of, for example, indium tin oxide (ITO) is formed on the interlayer insulating film 19 so as to cover the contact hole CH. Then, the transparent conductive film is selectively etched using photolithography (fifth photolithography step) to form the pixel electrode 20. The pixel electrode 20 is electrically connected to the source electrode 18 of the thin film transistor via the contact hole.

After that, though not shown in the figures, the organic EL display device is completed through steps similar to those in Embodiment 1.

Embodiment 3

Figure 21:
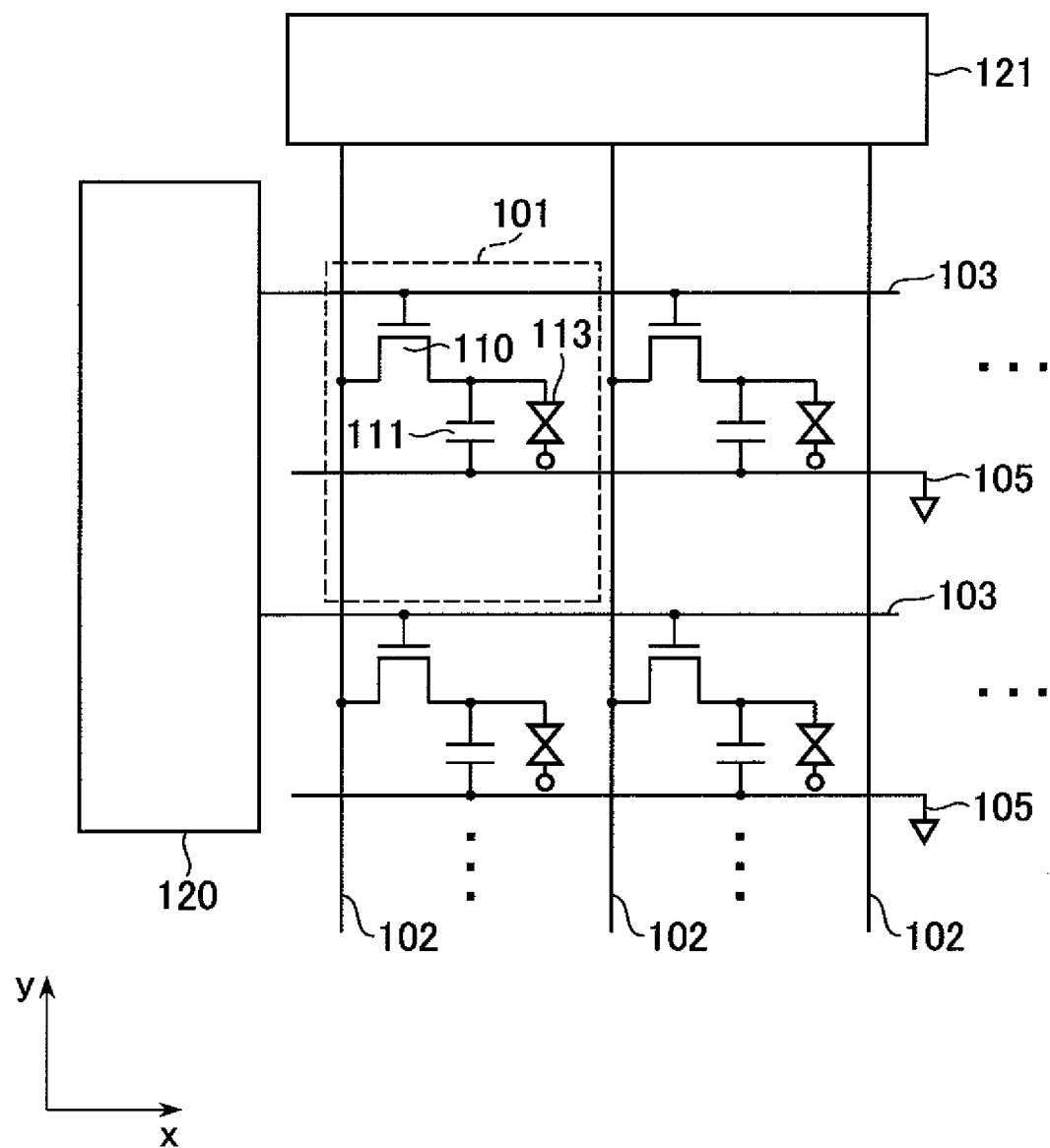
FIG. 21 is a circuit diagram of an embodiment of an equivalent circuit of a liquid crystal display device as the display device according to the present invention.

FIG. 21 illustrates an equivalent circuit of a liquid crystal display device as a display device according to the present invention.

In FIG. 21, gate lines 103 are formed so as to extend in an x direction of FIG. 21 and so as to be arranged in a y direction in parallel with one another. Each of the gate lines 103 is connected on one end side thereof to a gate driver 120 so as to be supplied with a scan signal in sequence. Further, common lines 105 are formed between adjacent gate lines 103, respectively, so as to be in parallel with the gate lines 103. Further, drain lines 102 are formed so as to extend in the y direction of FIG. 21 and so as to be arranged in the x direction of FIG. 21 in parallel with one another. Each of the drain lines 102 is connected on one end side thereof to a drain driver 121 so as to be supplied with a video signal.

A region surrounded by a pair of gate lines 103 adjacent to each other and a pair of drain lines 102 adjacent to each other is a region of a pixel 101. A display region is formed of an aggregation of a plurality of pixels 101 which are arranged in matrix. A switching element 110, an auxiliary capacitor 111, and a pair of electrodes (pixel electrode and counter electrode) are formed in the region of the pixel 101. Supply of a scan signal from the gate line 103 turns on the switching element 110 and a video signal from the drain line 102 is supplied to the pixel electrode. An electric field according to a potential difference between the pixel electrode and the counter electrode is caused at liquid crystal 113 to drive the liquid crystal 113. The auxiliary capacitor 111 is provided in order to maintain a video signal supplied to the pixel electrode for a comparatively long time. It is to be noted that the gate driver 120 and the drain driver 121 may be formed on a substrate having the pixel 101 formed thereon, or may be formed as an external LSI chip.

Figure 22A:
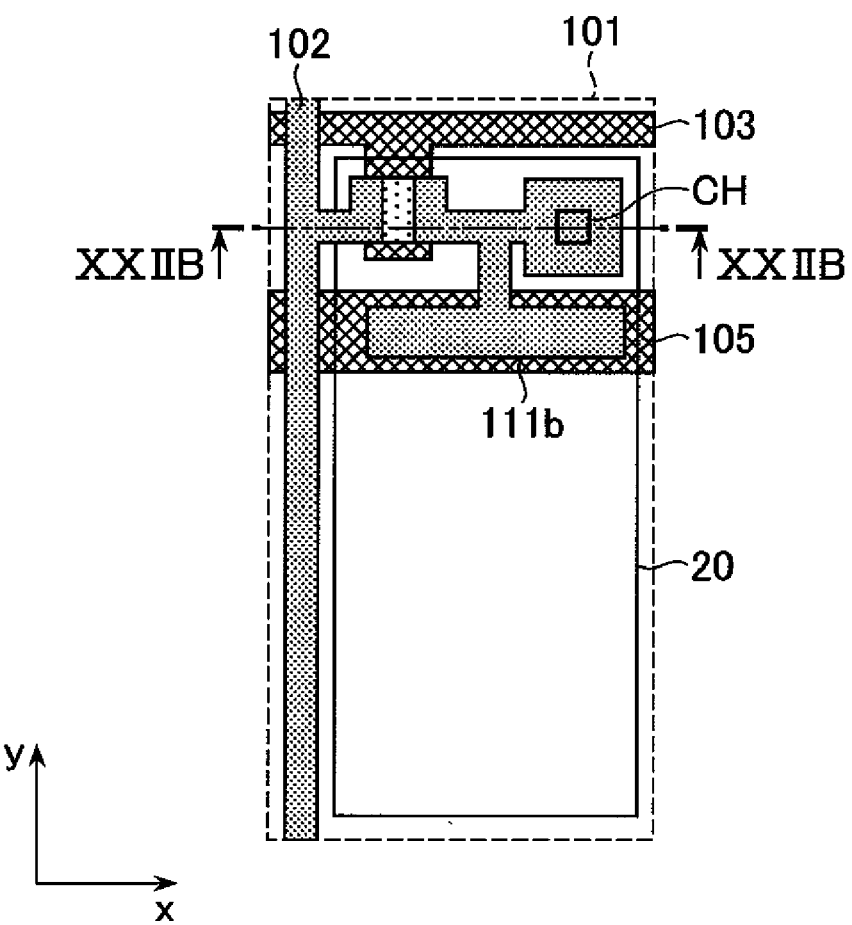
FIGS. 22A and 22B illustrate an embodiment of a structure of a pixel of the liquid crystal display device as the display device according to the present invention.
Figure 22B:
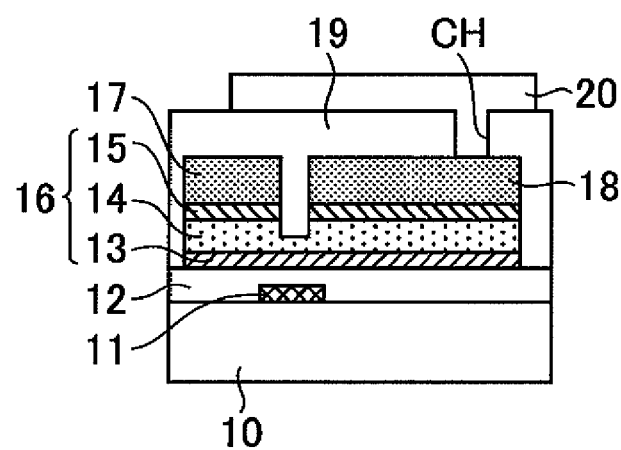

FIG. 22A is a plan view specifically illustrating the structure of the pixel 101 formed on a side of liquid crystal of one of substrates disposed so as to be opposed to each other with the liquid crystal sandwiched therebetween. FIG. 22B is a sectional view taken along the line XXIIB-XXIIB of FIG. 22A.

In FIGS. 22A and 22B, the gate line 103, a gate electrode 11 of the switching element 110 integrally formed with the gate line 103, and the common line 105 forming one electrode of the auxiliary capacitor 111 are formed by a metal film on a substrate 10. A gate insulating film 12 is formed so as to cover the metal film. A semiconductor laminated film 16 including a polycrystalline semiconductor film 13, a non-doped amorphous semiconductor film 14, and a heavily doped amorphous semiconductor film 15 laminated in sequence is formed on the gate insulating film 12.

The semiconductor laminated film 16 is formed not only in a region in which the switching element 110 is formed but also under a wiring connected to a drain electrode 17 and a source electrode 18 of the switching element 110 (the drain line 102, the other electrode 111b of the auxiliary capacitor 111, and the like). This is because, as is clear from description of a manufacturing method in the following, the semiconductor laminated film 16 is formed by carrying out etching with a photoresist film as a mask, which is used in forming the drain line 102, the other electrode 111b of the auxiliary capacitor, and the like on the semiconductor laminated film 16.

In this way, as illustrated in FIG. 1B, the semiconductor laminated film 16 is definitely formed under the metal film as the drain line 102 and the like. The semiconductor laminated film 16 is formed by laminating the polycrystalline semiconductor film 13, the non-doped amorphous semiconductor film 14, and the heavily doped amorphous semiconductor film 15 in sequence. Therefore, electric contact between the metal film and the polycrystalline semiconductor film 13 can be avoided, and electric contact between the heavily doped amorphous semiconductor film 15 and the polycrystalline semiconductor film 13 can be avoided. Therefore, leakage current in a current control element 110a can be significantly reduced, and fluctuations in current at low gate voltage can be suppressed.

It is to be noted that, as illustrated in FIG. 22B, in a channel region between the drain electrode 17 and the source electrode 18 of the switching element 110, the heavily doped amorphous semiconductor film 15 is completely etched away, and the non-doped amorphous semiconductor film 14 is etched so as to have a slight recess. This etching electrically isolates the drain electrode 17 and the source electrode 18.

An interlayer insulating film 19 is formed on the substrate 10 so as to cover the switching element 110, the auxiliary capacitor, and the like. A pixel electrode 20 as a transparent conductive film formed of, for example, indium tin oxide (ITO) is formed on the interlayer insulating film 19. The pixel electrode 20 is connected to the source electrode 18 of the switching element 110 via a contact hole CH formed in advance in the interlayer insulating film 19.

It is to be noted that, in this embodiment, the electrode paired with the pixel electrode 20 (counter electrode) is adapted to be formed on a side of the liquid crystal of the other substrate with the liquid crystal sandwiched between the two substrates (this type is sometimes referred to as a vertical electric field type). However, the present invention is not limited thereto, and the counter electrode may be formed on a side of the substrate 10 (this type is sometimes referred to as a lateral electric field type).

Embodiment 4

In the embodiments described above, a glass substrate is exemplarily used as the substrate. However, the substrate may be a flexible substrate made of a resin or the like. In an organic EL display device, when light is taken out to a surface on which the element is formed, in the case of a so-called top emission type, a metal substrate may be used. In this case, a display device with high impact resistance can be obtained.

Embodiment 5

In the embodiments described above, one thin film transistor is formed in one pixel. However, a plurality of thin film transistors may be connected, for example, in series. This structure can reduce display defects due to thin film transistors having large leakage current which are scattered and occur accidentally.

Embodiment 6

In the embodiments described above, silicon is used as the material of the semiconductor. However, the present invention is not limited thereto and other semiconductor materials including SiGe may also be used.

Embodiment 7

In the embodiments described above, the gate insulating film of the thin film transistor is formed by laminating a nitride film and an oxide film. However, a silicon oxynitride film may also be used. Then, both of satisfactory alkali ion barrier performance and satisfactory reliability can be obtained. Further, the gate insulating film may be formed by either one of a nitride film or an oxide film.

Embodiment 8

In the embodiments described above, the polycrystalline silicon film used as a semiconductor layer of the thin film transistor is formed by lamp annealing. However, the present invention is not limited thereto, and laser annealing, thermal CVD, plasma CVD, or Cat-CVD may also be used.

Embodiment 9

In the embodiments described above, the polycrystalline silicon film used as a semiconductor layer of the thin film transistor does not have impurities doped therewith. However, the present invention is not limited thereto, and, for example, impurities may be lightly doped to such an extent that conduction does not occur in an off state. The doping may be carried out by in-situ doping when the precursor film is formed or by ion implantation. This makes it possible to control the threshold value of the thin film transistor.

Embodiment 10

In the embodiments described above, no reference is made to the conductivity type (n type or p type) of the heavily doped amorphous semiconductor film used as a semiconductor layer of the thin film transistor. The heavily doped amorphous semiconductor film may be of an n type or of a p type.

Embodiment 11

In the embodiments described above, the semiconductor laminated film includes the heavily doped amorphous semiconductor film which functions as an ohmic contact layer, but the semiconductor laminated film may not include the heavily doped amorphous semiconductor film. Even in such a case, direct contact between the metal film such as the drain electrode and the source electrode and the polycrystalline semiconductor film can be avoided, and thus, the effect of the present invention can be obtained.

Embodiment 12

In the embodiments described above, the non-doped amorphous semiconductor film and the heavily doped amorphous semiconductor film used as semiconductor layers of the thin film transistor are arranged to be in direct contact with each other. However, a low concentration electric field relaxation layer may be disposed between them, which can further reduce leakage current.

Embodiment 13

In the embodiments described above, the interlayer insulating film formed so as to cover the thin film transistor is a silicon oxynitride film. However, the present invention is not limited thereto, and an organic material film or a laminate including an inorganic material film and an organic material film may also be used as the interlayer insulating film. This has the effect of being able to form a flat surface.

Embodiment 14

In the embodiments described above, the drain electrode and the source electrode of the thin film transistor are a metal film made of, for example, tungsten. However, the present invention is not limited thereto, and the metal film may be made of chromium, molybdenum, aluminum, copper, or an alloy thereof. Among them, aluminum, copper, and an alloy thereof can reduce the resistance of the wiring. Tungsten, chromium, molybdenum, and an alloy thereof have high heat resistance and can improve the tolerance of the process.

Embodiment 15

In the embodiments described above, the thin film transistor (TFT) is formed in each of the pixels. When, on the periphery of a display portion formed of an aggregation of pixels, drive circuits (gate driver 120 and drain driver 121) for driving the pixels are provided, all of which are formed on the same substrate, and the drive circuits are formed of thin film transistors, the present invention may be applied to the thin film transistors of the drive circuits.

The present invention is described above with reference to the embodiments. However, the structures described in the embodiments are only exemplary and the present invention may be modified or changed within the technical philosophy thereof. Further, the structures described in the embodiments may be combined so long as they do not contradict each other.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A method of manufacturing a display device having a thin film transistor formed on a substrate including a display portion, wherein the thin film transistor is manufactured by the following steps of:
    forming a gate insulating film so as to cover at least a gate electrode;
    forming on top of the gate insulating film at least a polycrystalline semiconductor film, an amorphous semiconductor film, a heavily doped amorphous semiconductor film, and a metal film in sequence,
    forming on the metal film a patterned photoresist;
    etching only the metal film by using the patterned photoresist film as a mask to form a drain electrode and a source electrode of the thin film transistor;
    forming a photoresist film on at least a channel region between the drain electrode and the source electrode;
    etching the heavily doped amorphous semiconductor film, the amorphous semiconductor film, and the polycrystalline semiconductor film in sequence by using the photoresist film and the metal film as a mask;
    removing the photoresist film; and
    etching the heavily doped amorphous semiconductor film by using the drain electrode and the source electrode as a mask to such an extent that the amorphous semiconductor film thereunder is exposed.

2. A method of manufacturing a display device according to claim 1, wherein the photoresist film is removed by ashing.

* * * * *